United States Patent
Edwards et al.

(10) Patent No.: US 9,552,902 B2
(45) Date of Patent: Jan. 24, 2017

(54) TRANSPARENT CONDUCTING OXIDES

(71) Applicant: ISIS Innovation Limited, Oxford (GB)

(72) Inventors: Peter P. Edwards, Oxford (GB); Martin Owen Jones, Oxford (GB); Malek Moshari Al-Mamouri, Belfast (GB); John Stuart Abell, Birmingham (GB)

(73) Assignee: OXFORD UNIVERSITY INNOVATION LIMITED, Oxford (GB)

(*) Notice: Subject to any disclaimer, the term of this patent is extended or adjusted under 35 U.S.C. 154(b) by 0 days.

(21) Appl. No.: 14/484,208

(22) Filed: Sep. 11, 2014

(65) Prior Publication Data

US 2014/0377479 A1 Dec. 25, 2014

Related U.S. Application Data (63) Continuation of application No. 12/920,083, filed as application No. PCT/GB2009/000534 on Feb. 26, 2009, now Pat. No. 8,859,104.

(30) Foreign Application Priority Data

Feb. 28, 2008 (GB) .................................. 0803702.0

(51) Int. Cl.
*H01B 1/08* (2006.01)
*H01B 13/00* (2006.01)
(Continued)

(52) U.S. Cl.
CPC .............. *H01B 1/08* (2013.01); *C03C 17/245* (2013.01); *C23C 14/086* (2013.01); *C23C 14/28* (2013.01);
(Continued)

(58) Field of Classification Search
None
See application file for complete search history.

(56) References Cited

U.S. PATENT DOCUMENTS 4,391,743 A 7/1983 Maeda et al.
4,705,701 A 11/1987 Akhtar
(Continued)

FOREIGN PATENT DOCUMENTS

EP 0 393 034 B1 10/1990
EP 0 490 493 A2 6/1992
(Continued)

OTHER PUBLICATIONS

Adurodija, F.O. et al. (May 1999). "Pulsed Laser Deposition of Low-Resistivity Indium Tin Oxide Thin Films at Low Substrate Temperature," *Jpn. J. Appl Phys* 38:2710-2716.
(Continued)

*Primary Examiner* — David Sample
(74) *Attorney, Agent, or Firm* — Morrison & Foerster LLP (57) ABSTRACT

The invention provides a transparent conducting film which comprises a compound of formula (I): $Zn_{1-x}[M]_xO_{1-y}[X]_y$ (I) wherein: x is greater than 0 and less than or equal to 0.25; y is from 0 to 0.1; [X] is at least one dopant element which is a halogen; and [M] is: (a) a dopant element which is selected from: a group 14 element other than carbon; a lanthanide element which has an oxidation state of +4; and a transition metal which has an oxidation state of +4 and which is other than Ti or Zr; or (b) a combination of two or more different dopant elements, at least one of which is selected from: a group 14 element other than carbon; a lanthanide element which has an oxidation state of +4; and a transition metal which has an oxidation state of +4 and which is other than Ti or Zr. The invention further provides coatings comprising the films of the invention, processes for
(Continued)

producing such films and coatings, and various uses of the films and coatings.

25 Claims, 6 Drawing Sheets

(51) Int. Cl.
*H01B 5/14* (2006.01)
*C03C 17/245* (2006.01)
*C23C 14/08* (2006.01)
*C23C 14/28* (2006.01)
*H01L 33/42* (2010.01)
*H01L 51/52* (2006.01)

(52) U.S. Cl.
CPC .............. *H01B 5/14* (2013.01); *H01B 13/003* (2013.01); *C03C 2217/213* (2013.01); *C03C 2217/216* (2013.01); *C03C 2217/23* (2013.01); *C03C 2217/24* (2013.01); *C03C 2217/241* (2013.01); *C03C 2217/242* (2013.01); *C03C 2217/944* (2013.01); *H01L 33/42* (2013.01); *H01L 51/5206* (2013.01); *H01L 51/5215* (2013.01); *Y10T 428/10* (2015.01); *Y10T 428/1055* (2015.01); *Y10T 428/24* (2015.01); *Y10T 428/24479* (2015.01)

(56) References Cited

U.S. PATENT DOCUMENTS

| | | | |
|---|---|---|---|
| 5,413,864 A | 5/1995 | Miyazaki et al. | |
| 5,532,062 A | 7/1996 | Miyazaki et al. | |
| 5,667,880 A | 9/1997 | Okaniwa | |
| 5,736,267 A | 4/1998 | Mitsui et al. | |
| 6,071,561 A | 6/2000 | Gordon et al. | |
| 6,146,765 A | 11/2000 | Mitsui et al. | |
| 6,200,680 B1 | 3/2001 | Takeda et al. | |
| 6,208,404 B1 | 3/2001 | Tomoyori et al. | |
| 6,368,892 B1 | 4/2002 | Arya | |
| 6,541,133 B1* | 4/2003 | Schicht ............... C03C 17/2453 427/164 | |
| 6,613,603 B1 | 9/2003 | Sano | |
| 6,677,063 B2 | 1/2004 | Finley | |
| 6,693,352 B1 | 2/2004 | Huang et al. | |
| 6,706,962 B2 | 3/2004 | Nelles et al. | |
| 6,805,601 B2 | 10/2004 | Aoki et al. | |
| 7,049,638 B2 | 5/2006 | Wu et al. | |
| 7,052,587 B2 | 5/2006 | Gibson et al. | |
| 7,122,842 B2 | 10/2006 | Hill | |
| 7,265,037 B2 | 9/2007 | Yang et al. | |
| 7,294,811 B2 | 11/2007 | Kawashima et al. | |
| 7,317,566 B2 | 1/2008 | Tench et al. | |
| 7,402,506 B2 | 7/2008 | Levy et al. | |
| 7,511,343 B2 | 3/2009 | Li et al. | |
| 7,726,263 B2 | 6/2010 | Ben-Ishai | |
| 8,859,104 B2 | 10/2014 | Edwards et al. | |
| 9,236,157 B2 | 1/2016 | Kuznetsov et al. | |
| 2002/0158236 A1* | 10/2002 | Kikkawa ............... C01G 15/00 252/519.3 | |
| 2003/0030376 A1 | 2/2003 | Aoki et al. | |
| 2003/0170437 A1 | 9/2003 | Kawashima et al. | |
| 2004/0113146 A1 | 6/2004 | Dahmani et al. | |
| 2004/0150778 A1 | 8/2004 | Izumi et al. | |
| 2004/0227891 A1 | 11/2004 | Hirota | |
| 2004/0247929 A1 | 12/2004 | Buhay et al. | |
| 2004/0252738 A1 | 12/2004 | Hill | |
| 2004/0262154 A1 | 12/2004 | Gibson et al. | |
| 2005/0000564 A1 | 1/2005 | Sato et al. | |
| 2005/0016583 A1 | 1/2005 | Blieske et al. | |
| 2005/0211290 A1 | 9/2005 | Deng et al. | |
| 2005/0233113 A1 | 10/2005 | Kotani et al. | |
| 2005/0274964 A1 | 12/2005 | Huang et al. | |
| 2006/0008580 A1 | 1/2006 | Nelles et al. | |
| 2006/0137738 A1 | 6/2006 | Ahn et al. | |
| 2006/0165572 A1 | 7/2006 | McHugh et al. | |
| 2006/0197438 A1 | 9/2006 | Conley, Jr. et al. | |
| 2006/0228974 A1 | 10/2006 | Thelss et al. | |
| 2006/0250078 A1 | 11/2006 | Lee et al. | |
| 2006/0255719 A1 | 11/2006 | Oikawa et al. | |
| 2006/0284171 A1 | 12/2006 | Levy et al. | |
| 2007/0116986 A1 | 5/2007 | Garg et al. | |
| 2007/0243328 A1 | 10/2007 | Liu et al. | |
| 2007/0273973 A1 | 11/2007 | Kursawe et al. | |
| 2007/0280848 A1 | 12/2007 | Narayan et al. | |
| 2007/0284590 A1 | 12/2007 | Goto et al. | |
| 2008/0108198 A1 | 5/2008 | Wager, III et al. | |
| 2008/0193638 A1 | 8/2008 | McMaster et al. | |
| 2008/0193717 A1 | 8/2008 | Jongerden et al. | |
| 2008/0280119 A1* | 11/2008 | Kishimoto ............ C23C 14/086 428/220 | |
| 2009/0001872 A1 | 1/2009 | Noel | |
| 2009/0081826 A1 | 3/2009 | Cowdery-Corvan et al. | |
| 2009/0101493 A1* | 4/2009 | Nakayama ............ C04B 35/453 204/192.11 | |
| 2009/0104455 A1 | 4/2009 | Chen et al. | |
| 2009/0229657 A1 | 9/2009 | Appadurai | |
| 2009/0303605 A1 | 12/2009 | Kirita | |
| 2010/0003511 A1 | 1/2010 | So | |
| 2011/0135848 A1 | 6/2011 | Edwards et al. | |
| 2012/0225250 A1 | 9/2012 | Kuznetsov et al. | |
| 2012/0228665 A1 | 9/2012 | Fukunaga et al. | |
| 2013/0309933 A1 | 11/2013 | Hirakata | |
| 2014/0141261 A1* | 5/2014 | Imran ................. C03C 17/3626 428/432 | |

FOREIGN PATENT DOCUMENTS

| | | | |
|---|---|---|---|
| EP | 0 490 493 A3 | 6/1992 | |
| EP | 0 490 493 B1 | 6/1992 | |
| EP | 0 807 846 A2 | 11/1997 | |
| EP | 0 807 846 A3 | 11/1997 | |
| EP | 0 842 046 B1 | 5/1998 | |
| EP | 0 893 833 A2 | 1/1999 | |
| EP | 0 893 833 A3 | 1/1999 | |
| EP | 0 893 833 B1 | 1/1999 | |
| EP | 1 135 838 B1 | 9/2001 | |
| EP | 1 139 161 A1 | 10/2001 | |
| EP | 1 178 709 A1 | 2/2002 | |
| EP | 1 178 709 A4 | 2/2002 | |
| EP | 1 701 396 A2 | 9/2006 | |
| EP | 1 701 396 A3 | 9/2006 | |
| EP | 1 701 396 B1 | 9/2006 | |
| EP | 1 732 139 A1 | 12/2006 | |
| EP | 1 732 362 A1 | 12/2006 | |
| EP | 1 732 362 A4 | 12/2006 | |
| EP | 1 796 108 A1 | 6/2007 | |
| EP | 1 796 108 A4 | 6/2007 | |
| EP | 1 847 632 A1 | 10/2007 | |
| EP | 1 850 401 A1 | 10/2007 | |
| EP | 1 865 558 A2 | 12/2007 | |
| EP | 1 865 558 A3 | 12/2007 | |
| EP | 1 905 874 A1 | 4/2008 | |
| EP | 1 905 874 A4 | 4/2008 | |
| EP | 1 930 471 A2 | 6/2008 | |
| GB | WO 2011027115 A2 * | 3/2011 | ............ C23C 18/08 |
| JP | 62-080918 A | 4/1987 | |
| JP | 7-288049 A | 10/1995 | |
| JP | 08-045352 A | 2/1996 | |
| JP | 2000-276943 A | 10/2000 | |
| JP | 2002-075062 A | 3/2002 | |
| JP | 2002-217429 A | 8/2002 | |
| KR | 10-2008-0064269 A | 7/2008 | |
| KR | 20080086335 A | 9/2008 | |
| WO | WO-98/08245 A2 | 2/1998 | |
| WO | WO-98/08245 A3 | 2/1998 | |
| WO | WO-01/73850 A2 | 10/2001 | |
| WO | WO-01/73850 A3 | 10/2001 | |
| WO | WO-01/73850 C1 | 10/2001 | |
| WO | WO-01/73903 A2 | 10/2001 | |
| WO | WO-01/73903 A3 | 10/2001 | |
| WO | WO-01/73903 C1 | 10/2001 | |
| WO | WO-2004/023436 A2 | 3/2004 | |

(56) References Cited

FOREIGN PATENT DOCUMENTS

| | | |
|---|---|---|
| WO | WO-2004/023436 A3 | 3/2004 |
| WO | WO-2004/050961 A1 | 6/2004 |
| WO | WO-2004/066346 A2 | 8/2004 |
| WO | WO-2004/066346 A3 | 8/2004 |
| WO | WO-2005/006391 A2 | 1/2005 |
| WO | WO-2005/006391 A3 | 1/2005 |
| WO | WO-2005/040044 A2 | 5/2005 |
| WO | WO-2005/040044 A3 | 5/2005 |
| WO | WO-2005/088717 A2 | 9/2005 |
| WO | WO-2005/088717 A3 | 9/2005 |
| WO | WO-2005/112144 A1 | 11/2005 |
| WO | WO-2005/125288 A2 | 12/2005 |
| WO | WO-2005/125288 A3 | 12/2005 |
| WO | WO-2006/012764 A1 | 2/2006 |
| WO | WO-2006/022497 A1 | 3/2006 |
| WO | WO-2006/138071 A1 | 12/2006 |
| WO | WO-2007/071663 A1 | 6/2007 |
| WO | WO-2007/135171 A2 | 11/2007 |
| WO | WO-2007/135171 A3 | 11/2007 |
| WO | WO-2007/138348 A2 | 12/2007 |
| WO | WO-2007/138348 A3 | 12/2007 |
| WO | WO-2008/027086 A1 | 3/2008 |
| WO | WO-2008/027086 A8 | 3/2008 |
| WO | WO-2008/106040 A2 | 9/2008 |
| WO | WO-2008/106040 A3 | 9/2008 |
| WO | WO-2008/118422 A1 | 10/2008 |
| WO | WO-2008/143526 A1 | 11/2008 |
| WO | WO-2009/014590 A2 | 1/2009 |
| WO | WO-2009/014590 A3 | 1/2009 |
| WO | WO-2009/014590 A9 | 1/2009 |
| WO | WO-2009/015192 A1 | 1/2009 |
| WO | WO-2009/042144 A2 | 4/2009 |
| WO | WO-2009/042144 A3 | 4/2009 |
| WO | WO-2009/064592 A1 | 5/2009 |
| WO | WO-2009/106828 A2 | 9/2009 |
| WO | WO-2009/106828 A3 | 9/2009 |

OTHER PUBLICATIONS

European Office Action dated Jun. 11, 2012 for EP Application No. 09715597.2, 6 pages.
Gordon, R.G. et al. (Aug. 2000). "Criteria for Choosing Transparent Conductors," *MRS Bulletin* pp. 52-57.
Groenen, R. et al. (2005, e-published Aug. 16, 2005). "Property Control of Expanding Thermal Plasma Deposited Textured Zinc Oxide with Focus on Thin Film Solar Cell Applications," *Thin Solid Films* 492:298-306.
Hamma, S. et al. (2001). "Low-Temperature Growth of Thick Intrinsic and Ultrathin Phosphorous or Born-Doped Microcrystalline Silicon Films: Optimum Crystalline Fractions for Solar Cell Applications," *Solar Energy Materials & Solar Cells* 69:217-239.
Hayamizu, S. et al. (Jul. 15, 1996). "Preparation of Crystallized Zinc Oxide Films on Amorphous Glass Substrates by Pulsed Laser Deposition," *J Appl Phys* 80(2):787-791.
Hiramatsu, M. et al. (Mar./Apr. 1998). "Transparent Conducting ZnO Thin Films Prepared by XeCl Excimer Laser Ablation," *J Vac Sci Technol A* 16(2):669-673.
Hirata, G.A. et al. (May/Jun. 1996). "High Transmittance-Low Resistivity ZnO:Ga Films by Laser Ablation," *J Vac Sci Technol A* 14(3):791-794.
Hu, J. et al. (Jan. 15, 1992). "Textured Aluminum-Doped Zinc Oxide Thin Films from Atmospheric Pressure Chemical-Vapor Deposition," *J. Appl Phys* 71(2):880-890.
Hu, J. et al. (Dec. 1, 1992). "Atmospheric Pressure Chemical Vapor Deposition of Gallium Doped Zinc Oxide Thin Films From Diethyl Zinc, Water, and Triethyl Gallium," *J Appl Phys* 72(11):5381-5392.
Islam, M.N. (1987). "The Effects of Deposition Variables on Spray-Deposited ZnO Thin Film Prepared From Zn(C2H3O2)2," *Journal of Materials Science* 22:1379-1384.
Kakinuma, K. et al. (2003). "The Relationship Between the Mean Dopant-Ion Radii and Conductivity of Co-Doped ZnO Systems, Zn1-x-yMxM'yO (M, M'=Al, In, Ga, Y)," *Journals of Materials Science* 38:7-11.

Kim, H. et al. (Jun. 7, 1999). "Indium Tin Oxide Thin Films for Organic Light-Emitting Devices," *Applied Physics Letters* 74(23):3444-3446.
Kim, H. et al. (2002). "Doped ZnO Thin Films as Anode Materials for Organic Light-Emitting Diodes," *Thin Solid Films* 420-421:539-543.
Kim, H. et al. (2002). "Epitaxial Growth of Al-Doped ZnO Thin Films Grown by Pulsed Laser Deposition," *Thin Solid Films* 420-421:107-111.
Komaru, T. et al. (2001). "Improved p-i-n Solar Cells Structure for Narrow Bandgap a-Si:H Prepared by Ar* Chemical Annealing at High Temperatures," *Solar Energy Materials & Solar Cells* 66:329-335.
Manifacier, J.C. (1982). "Thin Metallic Oxides as Transparent Conductors," *Thin Solid Films* 90:297-308.
Minami, T. et al. (1990). "Preparations of ZnO:Al Transparent Conducting Films by D.C. Magnetron Sputtering," *Thin Solid Films* 193/194:721-729.
Minami, T. (Jul./Aug. 1999). "Transparent and Conductive Multicomponent Oxide Films Prepared by Magnetron Sputtering," *J Vac Sci Technol A* 17(4):1765-1772.
Minami, T. (Aug. 2000). "New n-Type Transparent Conducting Oxides," *MRS Bulletin* 38-44.
Minami, T. (2005). "Transparent Conducting Oxide Semiconductors for Transparent Electrodes," *Semiconductor Science and Technology* 20:S35-S44.
Minami, T. (2008, e-published Mar. 31, 2007). "Substitution of Transparent Conducting Oxide Thin Films for Indium Tin Oxide Transparent Electrode Applications," *Thin Solid Films* 516:1314-1321.
Mizuhashi, M. (1980). "Electrical Properties of Vacuum-Deposited Indium Oxide and Indium Tin Oxide Films," *Thin Solid Films* 70:91-100.
Nam, J.G. et al. (2001). "Synthesis and Sintering Properties of Nanosized In2O3-10wt%SnO2 Powders," *Scripta Materialia* 44(8/9):2047-2050.
Notice of Allowance mailed Sep. 8, 2015, for U.S. Appl. No. 13/393,822, filed May 21, 2012, 8 pages.
Qadri, S.B. (Dec. 1, 2000). "Transparent Conducting Films of ZnO—ZrO2: Structure and Properties," *Journal of Applied Physics* 88(11):6564-6566.
Sato, H. (1994). "Transparent Conducting ZnO Thin Films Prepared on Low Temperature Substrates by Chemical Vapour Deposition Using Zn(C5H7O2)2," *Thin Solid Films* 246:65-70.
Schuler, T. (1999). "Optical, Electrical and Structural Properties of Sol Gel ZnO:Al Coatings," *Thin Solid Flims* 351:125-131.
Tahar, R.B.H. (Jul. 15, 1997). "Optical, Structural, and Electrical Properties of Indium Oxide Thin Films Prepared by the Sol-Gel Method," *J Appl Phys* 82(2):865-870.
Tominaga, K. et al. (May/Jun. 1998). "Properties of ZnO:In Film Prepared by Suttering of Facing ZnO:In and Zn Targets," *J Vac Sci Technol A* 16(3):1213-1217.
Xue, S. et al. (Jun. 17, 2010). "Study on the Preparation and Ion Implantation of ZnO-Based Films by Sol-gel Process," China Papers, located at <http:www.china-papers.com/?p+52651>, last visited Jul. 2, 2013, 3 pages.
Awasthi, N. et al. (2004). "Optical Properties of Transition Metal (Mn, Fe and V) Doped Zinc Oxide Ceramics and Thin Films," *Mat. Res. Soc. Symp. Proc.* 825E:G2.7.1-G2.7.6.
Das, A.K. et al. (Jul. 31, 2009). "Effect of Si Doping on Electrical and Optical Properties of ZnO Thin Films Grown by Sequential Pulsed Laser Deposition," *Journal of Physics D: Applied Physics* 42(165405):1-7.
Edwards, P.P. et al. (2004, e-published Aug. 6, 2004). "Basic Materials Physics of Transparent Conducting Oxides," *Dalton Trans.* 2995-3002.
Fang, Z.B. et al. (2005, e-pub. Apr. 29, 2005). "Transparent Conductive Tb-Doped ZnO Films Prepared by RF Reactive Magnetron Sputtering," *Materials Letters* 59:2611-2614.
Gordon, R.G. et al. (Dec. 1, 2001). "Transparent Conductors and Barrier Layers for Thin Film Solar Cells," *Harvard University* pp. 1-2. (Abstract Only).

(56) References Cited

OTHER PUBLICATIONS

Hu, J. et al. (1991). "Textured Fluorine-Doped ZnO Films by Atmospheric Pressure Chemical Vapor Deposition and Their Use in Amorphous Silicon Solar Cells," *Solar Cells* 30:437-450.

Huang, H. et al. (Nov. 2, 2007). "Influence of Annealing on Structural, Electrical and Optical Properties of Dy-Doped ZnO Thin Films," *Journal of Physics D: Applied Physics* 40:7041-7045.

International Search Report mailed on Jan. 7, 2010, for PCT Patent Application No. PCT/GB2009/000534, filed on Feb. 26, 2009, 8 pages.

International Search Report mailed on Feb. 18, 2011, for PCT Patent Application No. PCT/GB2010/001664, filed on Sep. 2, 2010, 5 pages.

Kang, H.S. et al. (2006, e-published Sep. 12, 2005). "Investigation on the Variation of Green, Yellow, and Orange Emission Properties of ZnO Thin Film," *Superlattices and Microstructures* 39:193-201.

Kerr, L.L. (Date Unknown). "Growth, Characterization and Thermodynamic Modeling of Absorber and Transparent Conducting Oxides for Copper Indium Diselenide Based Thin Film Solar Cells," Document Order No. AAI3135189 *The Sciences and Engineering*, 1 page. (Abstract Only).

Kim, I. et al. (2006, e-published Sep. 20, 2006). "Effect of Fluorine Addition on Transparent and Conducting Al Doped ZnO Films," *Journal of Applied Physics* 100(063701):1-6.

Lee, H.W. et al. (2005). "Preparation of Ti-Doped ZnO Transparent Conductive Thin films by PLD Method," *Journal of Ceramic Processing Research* 6(1):52-56.

Liang, H. (1998). "Atmospheric Pressure Chemical Vapor Deposition of Textured Zinc Oxide, Doped Titanium Dioxide, and Doped Zinc Oxide Thin Films," *The Science and Engineering* 59(01 B):270. (Abstract Only).

Lim, J.H. et al. (2009, e-published Jul. 9, 2009). "Solution-Processed InGaZnOOBased Thin Film Transistors for Printed Electronics Applications," *Applied Physics Letters* 95(012108):1-3.

Lin, W. et al. (Feb. 2008). "Properties of Doped ZnO Transparent Conductive Thin Films Deposited by RF Magnetron Sputtering Using a Series of High Quality Ceramic Targets," *Rare Metals* 27(1):32-35.

Linden, J.L. et al. (May 3, 2003). "Property Control of Transparent Conducting Oxides," *Society of Vacuum Coaters, Inc.* 576-579. (Abstract Only).

LV, M. et al. (2005, e-published Apr. 26, 2005). "Transparent Conducting Zironium-Doped Zinc Oxide Films Prepared by RF Magnetron Sputtering," *Applied Surface Science* 252:2006-2011.

Majumder, S.B. et al. (2003). "Investigations on Solution Derived Aluminium Doped Zinc Oxide Thin Films," *Materials Science and Engineering* B103:16-25.

Martinez, A.I. et al. (2005, e-published Feb. 5, 2005). "Effect of the Fluorine Content on the Structural and Electrical Properites of $SnO_2$ and ZnO—$SnO_2$ Thin Films Prepared by Spray Pyrolysis," *Thin Solid Films* 483:107-113.

Minami, T. et al. (Sep. 1986). "Highly Conductive and Transparent Silicon Doped Zinc Oxide Thin Films Prepared by RF Magnetron Sputtering," *Japanese Journal of Applied Physics* 25(9):L776-L779.

Mooney, J.B. et al. (1982). "Spray Pyrolysis Processing," *Ann. Rev. Mater. Sci.* 12:81-101.

Nunes, P. et al. (2002). "Effect of Different Dopant Elements on the Properties of ZnO Thin Films," *Vacuum* 64:281-285.

Ortíz, A. et al. (1988). "Lack of Chemical Interaction of Hydrogenated Amorphous Silicon with Indium-Doped Zinc Oxide Transparent Conductive Films," *Journal of Non-Crystalline Solids* 103:9-13.

Park, J-S. et al. (2009, e-published Jul. 6, 2009). "Flexible Full Color Organic Light-Emitting Diode Display on Polyimide Plastic Substrate Driven by Amorphous Indium Gallium Zinc Oxide Thin-Film Transistors," *Applied Physics Letters* 95(013503):1-3.

Pawar, B.N. et al. (2008, e-published Feb. 29, 2008). "Fluorine-Doped Zinc Oxide Transparent and Conducting Electrode by Chemical Spray Synthesis," *Applied Surface Science* 254:6294-6297.

Rodríguez-Báez, J. et al. (2006, e-published Dec. 19, 2005). "Influence of the Molar Concentration and Substrate Temperature on Fluorine-Doped Zinc Oxide Thin Films Chemically Sprayed," *Materials Letters* 60:1594-1598.

Sato, H. et al. (Nov./Dec. 1993). "Highly Transparent and Conductive Group IV Impurity-Doped ZnO Thin Films Prepared by Radio Frequency Magnetron Sputtering," *J. Vac. Sci. Technol .A.* 11(6):2975-2979.

Souletie, P. et al. (1988). "Growth and Characterization of Heteroeptiaxial ZnO Thin Films by Organometallic Chemical Vapor Deposition," *Journal of Crystal Growth* 86:248-251.

United Kingdom Search Report mailed on Aug. 22, 2008, for Great Britain Patent Application No. GB0803702.0, 1 page.

U.S. Department of Energy. (Date Unknown). "Basic Research Needs for Solar Energy Utilization," *Report of the Basic Energy Sciences Workshop on Solar Energy Utilization* Apr. 18-21, 2005, 276 pages.

Written Opinion mailed on Jan. 7, 2010, for PCT Patent Application No. PCT/GB2009/000534, filed on Feb. 26, 2009, 7 pages.

Written Opinion mailed on Feb. 18, 2011, for PCT Patent Application No. PCT/GB2010/001664, filed on Sep. 2, 2010, 8 pages.

Yi, S-H. et al. (Date Unknown). "Properties of Aluminum Doped Zinc Oxide Thin Film by Sol-Gel Process," *Process of SPIE* 6831(68311A):1-8.

* cited by examiner

Fig. 2    10 wt% SiO$_2$-ZnO 350°C- 850°C

Fig. 8

TRANSPARENT CONDUCTING OXIDES

CROSS-REFERENCE TO RELATED APPLICATIONS

This application is a continuation of U.S. application Ser. No. 12/920,083, which has an international filing date of Feb. 26, 2009, which is a U.S. National Stage Application of International Application No. PCT/GB2009/000534, filed on Feb. 26, 2009, which claims priority to British Patent Application No. 0803702.0, filed Feb. 28, 2008, which is incorporated herein by reference in its entirety.

FIELD OF THE INVENTION

The invention relates to transparent conducting films, to coatings comprising such films, to processes for producing such films and coatings, and to various uses of the films and coatings.

BACKGROUND TO THE INVENTION

Sn-doped $In_2O_3$ thin films [$In_{2-x}Sn_xO_3$: ITO] exhibit a remarkable combination of optical and electrical transport properties. These include a low electrical resistivity, which is typically in the order of $10^{-4}$ Ωcm. This property is related to the presence of shallow donor or impurity states located close to the host ($In_2O_3$) conduction band, which are produced by chemical doping of $Sn^{+4}$ for $In^{+3}$ or by the presence of oxygen vacancy impurity states in $In_2O_{3-x}$. The films also exhibit high optical transparency (>80%) in the visible range of the spectrum (P. P. Edwards, et al.; Dalton Trans., 2004, 2995-3002).

Transparent conductive coatings or layers which comprise ITO have many applications, including in liquid crystal displays, flat panel displays (FPDs), plasma displays, touch panels, electronic ink applications, organic light-emitting diodes, electroluminescent devices, optoelectronic devices, photovoltaic devices, solar cells, photodiodes, and as antistatic coatings or EMI shieldings. ITO is also used for various optical coatings, most notably infrared-reflecting coatings (hot mirrors) for architectural, automotive, and sodium vapor lamp glasses. Other uses include gas sensors, antireflection coatings, electrowetting on dielectrics, and Bragg reflectors for VCSEL lasers. Furthermore, ITO can be used in thin film strain gauges. ITO thin film strain gauges can operate at temperatures up to 1400° C. and can be used in harsh environments.

Due to the cost and scarcity of indium metal, the principle component of ITO, a stable supply of indium may be difficult to sustain for an expanding market for flat panel displays, solar cells and other applications. There is therefore an ongoing need to reduce the amount of indium or produce indium-free phases as alternative transparent conducting materials for transparent conductor applications.

SUMMARY OF THE INVENTION

The present inventors have provided transparent conducting films of doped zinc oxides that have temperature-stable electrical and optical properties which are comparable to those of ITO. The doped zinc oxide films are attractive for transparent conductor applications as they are easy to produce from inexpensive, abundant precursors, and are non-toxic. Furthermore, zinc oxide has a higher visible transmittance than many other conductive oxide films and is more resistant to reduction by hydrogen-containing plasma processes that are commonly used for the production of solar cells. Zinc oxide itself is also inexpensive, abundant in nature and non-toxic. It also has certain properties which are considered important for transparent conductors, such as a band gap of 3.4 eV, an intrinsic carrier concentration of about $10^6$ cm$^{-3}$ and an electron Hall mobility of 200 cm$^2$ V$^{-1}$ s$^{-1}$.

Accordingly, the present invention provides a transparent conducting film which comprises a compound of formula (I):

$$Zn_{1-x}[M]_xO_{1-y}[X]_y \quad (I)$$

wherein:
x is greater than 0 and less than or equal to 0.25;
y is from 0 to 0.1;
[X] is at least one dopant element which is a halogen; and
[M] is:
(a) a dopant element which is selected from: a group 14 element other than carbon; a lanthanide element which has an oxidation state of +4; and a transition metal which has an oxidation state of +4 and which is other than Ti or Zr; or
(b) a combination of two or more different dopant elements, at least one of which is selected from: a group 14 element other than carbon; a lanthanide element which has an oxidation state of +4; and a transition metal which has an oxidation state of +4 and which is other than Ti or Zr.

The invention further provides a process for producing a transparent conducting film, which film comprises a compound of formula (I):

$$Zn_{1-x}[M]_xO_{1-y}[X]_y \quad (I)$$

wherein:
x is greater than 0 and less than or equal to 0.25;
y is from 0 to 0.1;
[X] is at least one dopant element which is a halogen; and
[M] is:
(a) a dopant element which is selected from: a group 14 element other than carbon; a lanthanide element which has an oxidation state of +4; and a transition metal which has an oxidation state of +4 and which is other than Ti or Zr; or
(b) a combination of two or more different dopant elements, at least one of which is selected from: a group 14 element other than carbon; a lanthanide element which has an oxidation state of +4; and a transition metal which has an oxidation state of +4 and which is other than Ti or Zr;

which process comprises producing said film by pulsed laser deposition.

Typically, the process further comprises:
(a) providing a target material in a chamber, which target material comprises the elements Zn, O, [M] and optionally [X], wherein [M] and [X] are as defined above;
(b) providing a substrate in the chamber;
(c) focusing a pulsed laser beam on the target material to generate a plasma; and
(d) depositing the plasma on the substrate to form the film.

The pulsed laser deposition (PLD) process of the invention is particularly suitable for producing films, coatings and layers for transparent conductor applications because the composition of the grown film is close to that of the target, even for a multicomponent target. This provides control over the film's composition. PLD-produced films may also crystallize at lower deposition temperatures relative to other physical vapour deposition techniques due to the high kinetic energies of the ionized and ejected species in the laser plumes.

The invention further provides:
- a transparent conducting film which is obtainable by the process of the invention;
- a transparent conducting coating which comprises a transparent conducting film of the invention;
- an organic light-emitting device, an electroluminescent device, a solid-state light, a photovoltaic device, a solar cell, a photodiode, a transparent electronic device, an electrode, a display, a touch panel, a sensor, a window, flooring material, a mirror, a lense, a Bragg reflector, a strain gauge or a radio-frequency identification (RFD)) tag which comprises a transparent conducting coating of the invention or a transparent conducting film of the invention; and
- glass or a polymer which is coated with the transparent conducting coating of the invention.

DETAILED DESCRIPTION OF THE INVENTION

The films of the invention are both transparent and conducting. The word "transparent" as used herein means that the film has optical transmittance in the visible range of the spectrum, from about 400 nm to about 800 nm.

Usually, the film of the invention has a mean optical transparency in the visible range of the spectrum which is equal to or greater than about 50%. More typically, the mean optical transparency is equal to or greater than about 70%, or equal to or greater than about 75%. Even more typically, the mean optical transparency in the visible range of the spectrum is equal to or greater than about 80%. In one embodiment, the transparency of the film is optimised to a value equal to or greater than about 90%.

The word "conducting" as used herein means that the film is electrically conductive.

Pure zinc oxide films usually exhibit low conductivity (high resistivity) due to low carrier concentration. In order to decrease the electrical resistivity (increase electrical conductivity) it is necessary to increase either the carrier concentration or the carrier mobility in zinc oxide. The former may be achieved through either oxygen and/or zinc non-stoichiometry or doping with an impurity. Non-stoichiometric films have excellent electrical and optical properties, but they are not very stable at high temperatures. The films of the invention are therefore doped with at least one dopant element, [M]; the films of the invention have an electrical resistivity which is less than that of a pure, undoped, stoichiometric zinc oxide film, i.e. less than about $2.0 \times 10^{-2}$ $\Omega$cm.

Usually, the film of the invention has an electrical resistivity, $\rho$, of less than or equal to about $1.0 \times 10^{-2}$ $\Omega$cm. More typically, the film has an electrical resistivity of less than or equal to about $5.0 \times 10^{-3}$ $\Omega$cm, less than or equal to about $4.0 \times 10^{-3}$ $\Omega$cm or less than or equal to about $3.0 \times 10^{-3}$ $\Omega$cm. Even more typically, the film has an electrical resistivity of less than or equal to about $2.0 \times 10^{-3}$ $\Omega$cm.

In one embodiment, the film has an electrical resistivity of less than or equal to about $1.0 \times 10^{-3}$ $\Omega$cm. More typically, in this embodiment, the electrical resistivity is less than or equal to about $8.0 \times 10^{-4}$ $\Omega$cm, less than or equal to about $6.0 \times 10^{-4}$ $\Omega$cm, or less than or equal to about $5.0 \times 10^{-4}$ $\Omega$cm.

The film of the invention must be a thin film in order to provide transparency. Typically, the thickness of the film is selected to achieve an optimum balance between conductivity and transparency. Accordingly, the films of the invention usually have a thickness, d, of from about 100 Å (10 nm) to about 1 mm. More typically, the thickness, d, is from about 100 nm to about 100 μm. Even more typically, the thickness is from about 100 nm to about 1 μm or, for instance, from about 200 nm to about 500 nm. In one embodiment, the thickness is about 4000 Å (400 nm). In another embodiment, the thickness is about 3000 Å (300 nm).

The film of the invention is doped with at least one dopant element, [M]. This usually increases the carrier concentration, $\eta$, in the zinc oxide, without seriously reducing the Hall carrier mobility, $\mu$, thereby decreasing the electrical resistivity of the film. The carrier concentration; $\eta$, in the film of the invention is typically greater than that of a pure, undoped, stoichiometric zinc oxide film. Thus, typically, the carrier concentration, 17, in the film of the invention is greater than about $1\times10^{19}$ cm$^{-3}$. More typically, the carrier concentration, is equal to or greater than about $8\times10^{19}$ cm$^{-3}$ or, for instance, equal to or greater than about $1\times10^{20}$ cm$^{-3}$. Even more typically, q is equal to or greater than about $2\times10^{20}$ cm$^{-3}$. In one embodiment, it is equal to or greater than about $3\times10^{20}$ cm$^{-3}$, for instance equal to or greater than about $5\times10^{20}$ cm$^{-3}$, or equal to or greater than about $6\times10^{20}$ cm$^{-3}$. Typically, the Hall mobility, μ, is equal to or greater than about 10 cm$^2$ V$^{-1}$ s$^{-1}$. More typically, μ is equal to or greater than about 15 cm$^2$ V$^{-1}$ s$^{-1}$. In the films of the invention, the dopant, [M], may be a single dopant element selected from a group 14 element other than carbon; a lanthanide element which has an oxidation state of +4; and a transition metal which has an oxidation state of +4 and which is other than Ti or Zr. Alternatively, [M] may be a combination of two or more different dopant elements, in any relative proportion such that the total amount of dopant atoms, x, is still greater than 0 and less than or equal to 0.1. In the latter case, where [M] is a combination of two or more different dopant elements, at least one of said two or more elements is selected from a group 14 element other than carbon; a lanthanide element which has an oxidation state of +4; and a transition metal which has an oxidation state of +4 and which is other than Ti or Zr.

In one embodiment, where [M] is a combination of two or more different dopant elements, none of said two or more elements is Ga and at least one of said two or more elements is selected from a group 14 element other than carbon; a lanthanide element which has an oxidation state of +4; and a transition metal which has an oxidation state of +4 and which is other than Ti or Zr.

In another embodiment, where [M] is a combination of two or more different dopant elements, none of said two or more elements is a group 13 element and at least one of said two or more elements is selected from a group 14 element other than carbon; a lanthanide element which has an oxidation state of +4; and a transition metal which has an oxidation state of +4 and which is other than Ti or Zr.

In one embodiment, the transparent conducting film does not contain Ga. In another embodiment, the transparent conducting film does not contain any group 13 element.

In one embodiment, [M] is a combination of two or more different dopant elements, wherein:

at least one of said two or more different elements is selected from a group 14 element other than carbon; a lanthanide element which has an oxidation state of +4; and a transition metal which has an oxidation state of +4 and which is other than Ti or Zr; and at least one of said two or more different elements is selected from an alkali metal, an alkaline earth metal, a transition metal other than zinc, a p-block element, a lanthanide element or an actinide element. Typically, the p-block element is other than Ga. More typically, the p-block element is other than a group 13 element (i.e. it is other than B, Al, Ga, In and Tl).

In this embodiment, the alkali metal is typically selected from Li, Na, K, Rb and Cs. Typically, the alkaline earth metal is selected from Be, Mg, Ca, Sr and Ba. Usually, the transition metal other than zinc is selected from Sc, Ti, V, Cr, Mn, Fe, Co, Ni, Cu, Y, Zr, Nb, Mo, Tc, Ru, Rh, Pd, Ag, Cd, La, Hf, Ta, W, Re, Os, Ir, Pt, Au and Hg. More typically, the transition metal other than zinc is selected from Sc, Ti, Y, Zr, La and Hf. Typically, the p-block element is selected from B, Al, Ga, In, Tl, P, As, Sb, Bi, S, Se, Te and Po. In one embodiment, the p-block element is selected from B, Al, In, Tl, P, As, Sb, Bi, S, Se, Te and Po. In another embodiment, the p-block element is selected from P, As, Sb, Bi, S, Se, Te and Po.

In one embodiment, [M] is a combination of (i) an element selected from a group 14 element other than carbon; a lanthanide element which has an oxidation state of +4; and a transition metal which has an oxidation state of +4 and which is other than Ti or Zr; and (ii) a transition metal, p-block or lanthanide element which has an oxidation state of +3. The element which has an oxidation state of +3 may, for instance, be Al, Ga, In or Sc. In one embodiment, however, the element which has an oxidation state of +3 is other than Ga. In another embodiment, the element which has an oxidation state of +3 is other than a group 13 element.

Typically, the dopant [M] is a single dopant element selected from a group 14 element other than carbon; a lanthanide element which has an oxidation state of +4; and a transition metal which has an oxidation state of +4 and which is other than Ti or Zr.

The group 14 elements other than carbon are Si, Ge, Sn and Pb. Thus, typically, [M] is, or comprises, an element selected from Si, Ge, Sn and Pb. More typically, [M] is, or comprises, Si. Thus, [M] is typically a single dopant element which is Si, Ge, Sn or Pb; or a combination of two or more different dopant elements, one of which is Si, Ge, Sn or Pb. [M] is more typically a single dopant element which is Si; or a combination of two or more different dopant elements, one of which is Si.

Most typically, [M] is a single dopant element which is Si.

In the film of the invention the at least one dopant element which is a halogen, [X], may be a single halogen element. Thus, [X] may, for instance, be F or Cl. Typically [X] is F. Alternatively, [X] may be a combination of two or more different halogens, in any relative proportion such that the total amount of dopant halogen atoms, y, is still from 0 to 0.1. [X] may, for instance, be a combination of F and another halogen, for instance Cl. Typically, however, [X], when present, is a single halogen element which is F.

Accordingly, in one embodiment, the compound of the film of the invention is a compound of formula (II):

$$Zn_{1-x}[M]_xO_{1-y}F_y \qquad (II)$$

wherein x and [M] are as defined above and y is greater than 0 and less than or equal to 0.1.

In another embodiment, y is 0 and the compound of the film of the invention is a compound of formula (III):

$$Zn_{1-x}[M]_xO \qquad (III)$$

wherein x and [M] are as defined above.

Typically, [M] is a single dopant element which is Si and y is 0.

Accordingly, in one embodiment the film comprises a compound of formula (IV):

$$Zn_{1-x}Si_xO \qquad (IV)$$

wherein x is as defined above.

The term "lanthanide element which has an oxidation state of +4", as used herein, means any lanthanide element which has a stable oxidation state of +4, irrespective of whether or not the element has one or more other stable oxidation states. Such elements include Ce, Pr, Nd, Tb and Dy. Accordingly, in the transparent conducting film of the invention, or in the process of the invention, [M] may be, or may comprise, an element selected from Ce, Pr, Nd, Tb and Dy. Typically, when [M] is a lanthanide, it is, or comprises, Ce.

The term "transition metal which has an oxidation state of +4", as used herein, means any transition metal which has a stable oxidation state of +4, irrespective of whether or not the transition metal can exist in one or more other oxidation states. Many transition metals other than Ti and Zr have a stable oxidation state of +4. Such transition metals include Hf, V, Mn, Nb, Mo, Tc, Ru, Rh, Pd, Ta, W, Re, Os, Ir and Pt. Accordingly, [M] may be, or may comprise, an element selected from Hf, V, Mn, Nb, Mo, Tc, Ru, Rh, Pd, Ta, W, Re, Os, Ir and Pt.

The dopant [M] is, or comprises, an element which has an oxidation state of +4. Thus, as the dopant [M] is introduced into the zinc oxide, it is typically oxidised to $[M^{4+}]$, nominally replacing $Zn^{2+}$, producing two electrons for each zinc atom replacement. This serves to increase the electron density (carrier concentration) in the sample and decrease resistivity. Typically, in practice, the resistivity decreases and reaches a minimum value as the amount of dopant is increased to an "optimum" concentration; then, if the dopant concentration is increased further, the resistivity increases again and the carrier concentration decreases. Without wishing to be bound by theory, it is thought that this decrease in carrier concentration and increase in resistivity beyond the "optimum" dopant concentration may be due to increased disorder of the crystal lattice, which causes phonon scattering and results in a decrease in the mobility and free carrier concentration. Alternatively, the increase in resistivity may be due to the dopant atoms forming neutral defects, which do not contribute free electrons, or to an increase in the concentration of electron traps as a result of excess doping. The maximum dopant concentration in the films of the invention is typically 25 atom % (based on the total number of Zn and dopant atoms). More typically, the dopant concentration is less than about 10 atom %, for instance, less than about 5 atom %. Even more typically, the dopant concentration is less than or equal to about 4 atom %. Even more typically, the dopant concentration is from about 1 to about 4 atom %, for instance from about 1.5 to about 3.5 atom %, or from about 2 to about 3 atom %. Accordingly, x, in the compound of formula 1, is greater than 0 and less than or equal to 0.25. Typically, x is greater than 0 and less than or equal to 0.1. More typically, x is greater than 0 and less than or equal to about 0.05; x may for instance be from about 0.01 to about 0.05, or from about 0.01 to about 0.04, for instance from about 0.015 to about 0.035, or from about 0.02 to about 0.03. In one embodiment x is from about 0.03 to about 0.05, for instance x is about 0.04. In another embodiment, x is about 0.03, for instance 0.027.

Typically, the crystal structure of the film of the invention (which may be studied by X-ray diffraction) is similar to that of an undoped ZnO film. The film of the invention is usually a polycrystalline film. More typically, it is a polycrystalline, c-axis-oriented film.

Usually, the root-mean-square (RMS) surface roughness of the film of the invention is less than that of a pure, undoped stoichiometric zinc oxide film. In one embodiment, the film has a root-mean-square surface roughness value which is equal to or less than 3.0 nm. The root-mean-square surface roughness of a film can be measured using atomic force microscopy (AFM).

Typically, the transparent conducting films of the invention are produced by pulsed laser deposition (PLD).

PLD is a powerful tool for growth of complex compound thin films. In conventional nanosecond PLD, a beam of pulsed laser light with a typical pulse duration of a few nanoseconds is focused on a solid target. Due to the high peak power density of the pulsed laser, the irradiated material is quickly heated to above its melting point, and the evaporated materials are ejected from the target surface into a vacuum in a form of plasma (also called a plume). For a compound target, the plume contains highly energetic and excited ions and neutral radicals of both the cations and the anions with a stoichiometric ratio similar to that of the target. This provides one of the most unique advantages of PLD over the conventional thin film growth techniques such as chemical vapor deposition (CVD) and molecular beam epitaxy (MBE). The PLD process of the invention is therefore advantageous because the composition of the grown film is close to that of the target, even for a multicomponent target, which provides additional control over the film's composition. PLD-produced films may also crystallize at lower deposition temperatures relative to other physical vapour deposition techniques (e.g. dc magnetron sputtering) due to the high kinetic energies of the ionized and ejected species in the laser plumes.

Typically, the process of the invention, for producing a transparent conducting film of the invention by PLD, comprises:
(a) providing a target material in a chamber, which target material comprises the elements Zn, O, [M] and optionally [X], wherein [M] and [X] are as defined above;
(b) providing a substrate in the chamber;
(c) focusing a pulsed laser beam on the target material to generate a plasma; and
(d) depositing the plasma on the substrate to form the film.

Different dopant elements [M] and different halogen dopant elements [X] can be incorporated into the film by using a solid target material made of ZnO powder mixed with different impurity compounds. For instance, one can simply choose compounds that contain the desired dopant elements [M] and/or [X]. Typically, one chooses one or more oxides of the dopant element(s) [M]. Similarly, one or more halides can be chosen for introducing the dopant elements [X]. Furthermore, the dopant concentration can be controlled by varying the weight percentage of the dopant compound or compounds.

Typically, the molar ratio of Zn to [M] in the target is (1−x):x wherein x is greater than 0 and less than or equal to about 0.25. More typically, x is greater than 0 and less than or equal to about 0.1. Even more typically, x is greater than 0 and less than or equal to about 0.05, and more typically x is from about 0.01 to about 0.05, or from about 0.01 to about 0.04, for instance from about 0.015 to about 0.035, or from about 0.02 to about 0.03. In one embodiment x is from about 0.03 to about 0.05, for instance about 0.04. In another embodiment x is about 0.03, for instance 0.027.

Typically, the molar ratio of O to [X] in the target is (1−y):y wherein y is from 0 to 0.1. In one embodiment, [X] is absent and y is 0.

The target material is typically prepared by heating a mixture of zinc oxide and an oxide of [M]. Typically, the mixture is heated at a temperature which is from about 600° C. to about 1000° C. More typically, the mixture is heated at about 800° C.

When [M] is Si, the concentration of the oxide of [M], $SiO_2$, in the mixture of zinc oxide and $SiO_2$ is typically greater than about 0.5 weight %. More typically, the concentration of $SiO_2$ in the mixture is from about 1.0 weight % to about 5.0 weight %. Even more typically, the concentration of $SiO_2$ is from about 1.5 weight % to about 4.0 weight %, for instance about 2.0 weight %. The resistivity and carrier concentration of the resulting film are typically maximised when this concentration of $SiO_2$ is used in the target material.

Usually, the mixture of zinc oxide and the oxide of [M] is prepared by mixing zinc oxide powder and a powder of the oxide of [M] in a suitable solvent, for instance acetone. Typically, the mixture is heated at a temperature which is from about 600° C. to about 1000° C. More typically, the mixture is heated at about 800° C. Typically, the mixture is heated at the temperature for about 8 hours or longer, more typically for about 12 hours or longer.

After heating, the mixture is usually ground and then heated again, at a second temperature for a further period of time. Typically, the second temperature is from about 600° C. to about 1000° C., and is more typically about 700° C. The further period of time is usually about 4 hours or longer, more typically about 7 hours or longer.

After preparation of the target material as described above, the material is typically compacted to form the target. This may be done using a standard pellet press. The compacted target is then usually heated, to lend mechanical strength to the target. Typically, the compacted target is heated at a temperature which is from about 600° C. to about 1000° C., for instance at about 800° C. The compacted target is usually heated for about 4 hours or longer, more typically for about 7 hours or longer.

Accordingly, the target material typically comprises (i) a mixture of zinc oxide and an oxide of [M], and/or (ii) [M]-doped zinc oxide. In one embodiment, the target material comprises a mixture of (i) zinc oxide, (ii) an oxide of [M], and (iii) [M]-doped zinc oxide. The [M]-doped zinc oxide may be a compound of formula (I) in which y is 0.

Usually, the target material comprises an intimate mix of oxides, for instance an intimate mixture of zinc oxide, an oxide of [M] and/or [M]-doped zinc oxide. The intimate mix is important for even deposition. Without wishing to be bound by theory, it is thought that the high energy of the deposition process and the atom-by-atom growth of the film from the mixed atomic plasma are important for forming homogeneous films of the invention.

The inventors have devised a convenient solution-based process, exemplified below in Example 2, for producing an [M]-doped zinc oxide. The [M]-doped zinc oxide thus produced is typically a compound of formula (I) as defined above in which y is 0.

The solution-based process comprises:
(a1) heating a solution comprising a zinc compound and a compound comprising [M], wherein [M] is as defined above;
(a2) performing a solvent removal step; and
(a3) heating the resulting solid to produce said [M]-doped zinc oxide.

This solution-based process can be used to produce the target material used in step (a) of the process of the invention for producing a transparent conducting film by PLD. It can also be used to produce suitable target materials for other processes for producing the transparent conductive films of the invention, e.g. physical vapour deposition techniques such as dc magnetron sputtering.

Accordingly, in one embodiment, the target material used in step (a) of the process of the invention for producing a transparent conducting film by PLD, is produced by:
(a1) heating a solution comprising a zinc compound and a compound comprising [M];
(a2) performing a solvent removal step; and
(a3) heating the resulting solid to produce said target material.

This solution-based process for producing the target material can advantageously be carried out at a relatively low temperature. Typically, the temperature of said heating in step (a1) does not exceed 200° C. Typically, the temperature of said heating in step (a3) does not exceed 500° C.

Any suitable zinc compound may be used, as can any suitable compound comprising [M]. The zinc compound is typically a zinc salt. The zinc compound is usually soluble in the solvent or mixture of solvents employed in the reaction. Typically, the zinc compound is zinc citrate. The compound comprising [M] is typically a salt of [M]. Again, the compound comprising [M] is typically soluble in the solvent or mixture of solvents employed. Typically, [M] is Si and the compound comprising [M] is a silicon salt, for instance silicon tetra-acetate.

Any suitable solvent or mixture of solvents may be employed. Typically, the solvent comprises water and/or an alcohol. More typically, the solvent comprises a water and a polar organic solvent, for instance ethylene glycol.

In one embodiment, the zinc compound is zinc citrate and the compound comprising [M] is silicon tetra-acetate. Typically, in this embodiment, step (a1) comprises treating a solution of zinc citrate with a solution of silicon tetra-acetate in the presence of heat. Typically, the zinc citrate solution is an aqueous or alcoholic solution, more typically an aqueous solution. The solvent used for the solution of silicon tetra-acetate may be a polar organic solvent, for instance ethylene glycol. Usually, the temperature at which the solution of zinc citrate is treated with the solution of silicon tetra-acetate is from 70 to 150° C., more typically, from 80 to 120° C. This heating is typically carried out for from 0.5 to 4 hours, more typically for about 2 hours. Typically, the resulting solution is then heated at a higher temperature of from 110 to 150° C., typically at about 130° C. Usually, a clear to yellow solution is then formed. Then, subsequently, the reaction mixture is typically heated at a second period of time (for instance about 5 to 20 hours, more typically about 14 hours) at a still higher temperature, for instance at a temperature of from 150 to 200° C., for instance at a temperature of from 160 to 190° C., or at a temperature of from 170 to 180° C. This typically results in the formation of a dark solution.

Typically, step (a2) comprises heating the resulting solution to dryness. The temperature at which the solution is heated to dryness can be any suitable drying temperature, but is usually from 200 to 300° C., for instance about 250° C. The resulting solid is typically ground before it is heated again in step (a3).

Usually, step (a3) comprises heating the resulting solid at a temperature of from 300 to 500° C. For instance, the solid may be heated at a first temperature of from 300 to 400° C. and subsequently at a second temperature of about 350 to 500° C.

The zinc citrate solution used in step (a1) may be produced by treating a citric acid solution with zinc oxide. Typically, the resulting mixture is heated, for instance to a temperature of from 50 to 90° C., e.g. to about 70° C. Usually a small amount of a mineral acid, typically nitric acid, is added to the reaction mixture.

The silicon tetra-acetate solution is typically produced by dissolving silicon tetra-acetate in hot ethylene glycol.

In the process of the invention for producing a transparent conducting film by PLD, any suitable substrate can be used. Typically, the substrate is glass, for instance borosilicate glass. However, alternative suitable substrates include sapphire, silicon carbide, alumina ($Al_2O_3$), zinc oxide (ZnO), yttrium-stabilised zirconium (YSZ), zirconium oxide ($ZrO_2$), any transparent oxide single crystal, fused silica, quartz and transparent polymer substrates. The transparent polymer may, for instance, be polyethylene terephthalate (PET), poly(methyl methacrylate) (PMMA), polyethylenenaphthalate (PEN) or polycarbonate (PC).

Before the ablation and deposition steps (c) and (d) are performed, the chamber is typically evacuated. Usually, the pressure in the chamber is reduced to less than $1\times10^{-5}$ Torr, for instance to about $5\times10^{-6}$ Torr. After evacuation, the chamber is then backfilled with a gas which comprises oxygen. Typically, the chamber is backfilled such that the partial pressure of oxygen in the chamber is from about 2 mTorr to about 5 mTorr. The gas with which the chamber is backfilled may be oxygen or a mixture of oxygen with an inert gas, for instance a mixture of oxygen and argon.

Any suitable pulsed laser source may be used. In one embodiment, the laser is a excimer laser, more typically a KrF excimer laser. Laser ablation occurs when the laser beam is focused on the target surface. Typically, during PLD growth, the laser focal spot is fixed while the disk-shaped target is rotated around its surface normal axis and laterally translated back and forth along its surface. This is equivalent to scanning the laser beam across the target surface. Usually, absorption of laser radiation by the target produces, sequentially, melting, vaporization, ejection and plasma (plume) formation.

The wavelength, frequency and power of the pulsed laser beam can depend on, for instance, the specific target material and substrate being used, the atmosphere in the chamber and the particular application of the thin film being formed.

Typically, the laser has a wavelength of from 120 nm to 337 nm. More typically, the wavelength of the laser is 248 nm.

Typically, the laser has an energy per pulse of from 200 mJ to 400 mJ.

Typically, the laser repetition frequency in step (c) of the process is from about 1 Hz to about 100 Hz. More typically, the laser repetition frequency is about 10 Hz.

The pulse duration of each pulse of the pulsed laser beam is typically from about 1 ns to about 100 ns. More typically, the pulse duration is about 10 ns.

The substrate is usually mounted on a substrate heater which can heat the substrate during the deposition process. Typically, during steps (c) and (d) of the process, the substrate is held at a temperature of from 50° C. to 800° C. More typically, the substrate is held at about 350° C.

Typically, the target and the substrate are moveable within the chamber, and can be moved, for instance translated or rotated, during the deposition process.

Accordingly, the substrate is typically mounted on a manipulator which provides for lateral and rotational movement to the substrate in its surface plane. Because the substrate can be laterally translated in the x-y plane, this setup provides a solution to scale up PLD for large area thin film deposition.

The distance between the substrate and the target may also be adjusted using the substrate manipulator.

When the substrate is away from the target, relatively large area thin films can be grown, using the wide angular distribution of the ablation plume further away from its root.

When the substrate is very close to the target, due to the small substrate-target distance and the narrow angular distribution of the ablation plume at its root, small features can be grown on the substrate with sizes similar to the laser focal spot (for instance, from a few microns to submicron diameter). Thus, one purpose of bringing the substrate close to the target is to obtain small deposition features. Furthermore, by laterally translating the substrate, patterned structures (e.g., periodic lines, grids, and dots) can be grown.

Patterned structures can also be grown by masking the substrate.

Usually, during steps (c) and (d) of the process of the invention, the substrate is held at a fixed distance of from about 10 mm to about 100 mm from the target. More typically, the distance between the substrate and target is 73 mm.

By alternating targets of different materials, multilayers of thin films can be grown.

Accordingly, in one embodiment of the process of the invention, the process further comprises (i) providing one or more further target materials in the chamber, which one or more further target materials are different from the target material which comprises zinc oxide and [M], and (ii) growing a multilayer film on said substrate by alternatively using the different target materials.

Typically each target material is placed in a separate target holder, each of the target holders being present in a carousel. In this way, multi-layer thin films can be deposited by rotating the carousel and thereby alternating the target material.

In one embodiment, the film of the invention comprises a plurality of layers.

The formation of multiple-layer films in this way can be useful for forming different layers of an electrochemical device, for instance a photovoltaic device or an electroluminescent device.

With the above-mentioned capability of precise deposition of micron-scale features using the process of the invention, two-dimensionally patterned structures such as arrays of dots and lines can be obtained simply by positioning the substrate close to the target and translating the substrate laterally. This process can thus serve as a means of "direct writing" of the films of the present invention. The term "direct writing" describes a range of technologies which can fabricate two or three dimensional functional structures, in situ, directly onto flat or conformal surfaces in complex shapes. This can be on a micro scale or nano scale. Direct writing can address potentially difficult substrate materials, demands of high precision forms, reconfigurable designs and direct fabrication of a robust finished product. There are diverse benefits for business from direct writing technology. From rapid and cost-effective prototyping to novel functionality, it is expected to deliver major advantages to business in the long term. The PLD process of the present invention can be used to produce complex patterned transparent conducting films by direct writing.

Accordingly, in one embodiment step (d) of the process further comprises forming a patterned structure, usually a two-dimensionally patterned structure, on the substrate by positioning the substrate close to the target material and laterally translating the substrate during deposition.

In another embodiment the process of the invention further comprises: (i) positioning the substrate at a first distance from the target material, and allowing the plasma to be deposited on the substrate to form a large area film; and (ii) positioning the substrate at a second distance from the target material, which second distance is shorter than the first distance, and allowing the plasma to be deposited to form patterned structures on said substrate.

A combination of the two film growth processes, at long and short target-substrate distances, can provide a variety of designed growth patterns. 3D structures can be built up in this way. For instance, by alternating growth processes at long and short substrate-target distances using a different target material at each distance, lateral (in-plane) periodic structures can be obtained and then covered with intermediate layers of different materials.

Accordingly, in one embodiment, the process further comprises forming a three-dimensionally patterned structure on the substrate. Typically, this embodiment comprises depositing combinations of (i) arrays of dots and/or lines, and (ii) thin layers, by controlling the distance between the substrate and the target material and by laterally translating the substrate.

Accordingly, in one embodiment, the film of the invention has a patterned structure. The patterned structure may be a two-dimensionally patterned structure or a three-dimensionally patterned structure.

Patterned structures may also be formed using other patterning techniques, for instance by etching the film or by lithography, screen printing or ink jet printing. In this way, the resulting film can have any desired two-dimensional or three-dimensional pattern.

A patterned film structure is useful in many applications, including in the design of printed electrodes or circuit boards, for instance, where the transparent conductive film is only desired in certain specific places.

In order that the transparent conductive film is deposited on only a portion of the substrate, the substrate surface may be masked before depositing the film on the substrate. In this way the film is only formed on the unmasked areas of the substrate, and does not form on the masked areas. Additionally or alternatively, patterning techniques such as ink jet printing, screen printing, direct writing or lithography can be applied to control exactly on which parts of the surface the film is formed. For example, by direct-writing or ink jet printing onto the surface of the substrate in certain places only, film formation occurs only at those places. The resulting film will then have a specific two-dimensional pattern.

Accordingly, in one embodiment of the process of the invention, the film is deposited on only a portion of the surface of the substrate to form a patterned film. Typically, this is achieved by using a patterning technique (for instance by direct writing) or by masking one or more portions of the substrate prior to film formation.

Advantageously, ZnO is an etchable material, so etching can also be used to pattern the transparent conducting films of the invention.

Accordingly, in another embodiment of the process of the invention, the process further comprises subjecting the film to an etching process, thereby producing a patterned film. Any suitable etchant can be used, for instance HBr, HCl, HF and HF/NH$_4$. In one embodiment, the etchant is an HBr, HCl, HF or HF/NH$_4$ etch bath.

Such patterning and etching techniques can be performed more than once and/or in combination with one another, leading to the build-up of a complex two- or three-dimensional film pattern.

The transparent conducting films of the invention have electrical and optical properties which are comparable to those of ITO. Furthermore, the films are non-toxic and produced from precursors which are cheaper and more abundant than indium metal. The films therefore represent an attractive alternative to ITO, and can in principle be used instead of ITO in any of the transparent conductor applications of ITO. Since the cost of making ZnO is very low, ZnO is particularly attractive for large scale applications such as solid-state lighting, transparent electronics, flat-panel displays and solar cells (particularly large-area solar cells).

By virtue of its electrical and optical properties, the doped zinc oxide film of the invention is particularly suitable for use as a transparent conducting coating in many of the applications for which ITO is useful. For instance, film of the invention may be used as an antistatic coating, an optical coating, a heat-reflecting coating, an antireflection coating, an electromagnetic interference shield, a radio-frequency interference shield, an electrowetting coating, or a coating for a display, touch panel or sensor. A heat-reflecting coating comprising a doped zinc oxide film of the invention is particularly useful as a coating for a window, for instance an architectural or automotive window. Such heat-reflecting coatings may also be used in vapour lamp glasses.

Accordingly, the invention further provides a transparent conducting coating which comprises a transparent conducting film of the invention.

Accordingly, the invention also provides glass which is coated with a transparent conducting coating of the invention.

The transparent conducting coatings and films of the invention can also be used in electronic devices, for instance in organic light-emitting devices, electroluminescent devices, photovoltaic devices, solar cells and photodiodes. They can also be used in electrodes and in displays, for instance in liquid crystal displays, electroluminescent displays, electrochromic displays, flat panel displays, plasma displays, electronic paper and field emission displays. Additionally, the coatings and films may be usefully employed in touch panels, sensors, flooring material (for instance to provide antistatic flooring), mirrors, lenses, Bragg reflectors, strain gauges or a radio-frequency identification (RFID) tags.

Accordingly, the invention further provides an electronic device; an electrode, a display, a touch panel, a sensor, a window, a floor material, a mirror, a lens, a Bragg reflector, a strain gauge or a radio-frequency identification (RFID) tag which comprises a transparent conducting coating of the invention or a transparent conducting film of the invention.

The invention additionally provides a substrate which is coated with a transparent conducting coating of the invention. Typically, the substrate is a polymer or glass. Typically, the polymer is flexible. The polymer may be any suitable polymer and is typically a conjugated polymer, for instance PET (polyethylene terephthalate). Such coated polymers are useful in flexible electronics applications.

The present invention is further illustrated in the Examples which follow:

EXAMPLES

Example 1

Synthesis of Doped Zinc Oxide Thin Films

This Example details the synthesis of doped zinc oxide thin films of the invention with electrical and optical properties that are comparable to ITO. In this Example, silicon is used as the dopant element [M]. These materials are attractive for transparent electrode applications as they are easy to grow from very cheap and abundant, precursors and are non-toxic.

1. Experimental Procedure 1.1 Pulsed Laser Deposition System

Figure 1:
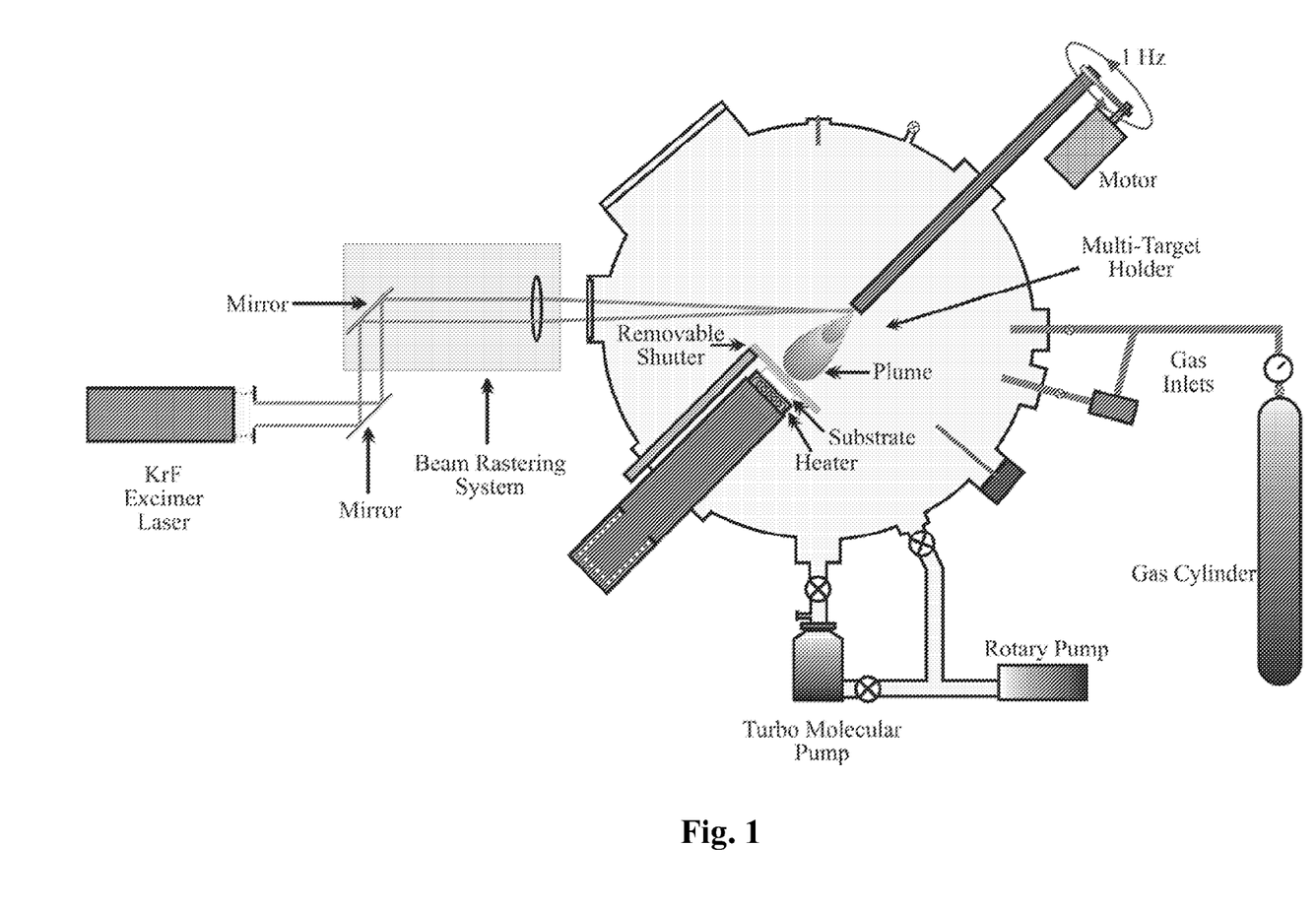
FIG. 1 is a schematic illustration of the pulsed laser deposition apparatus.

FIG. 1 shows a schematic diagram of the PLD apparatus. The stainless steel vacuum chamber was evacuated by the turbo molecular pump to the base pressure at approximately $10^{-7}$ torr.

There are six target holders and one substrate holder in the chamber. The six target holders are on the carrousel. In this way, multilayer thin films can be deposited by rotating the target carrousel.

A KrF excimer laser (Lambda physics LPX 300) with a wavelength of 248 nm was used for ablation of a pure ZnO target and Si-doped ZnO targets (i.e. targets containing 0-5 wt % of $SiO_2$, corresponding to about 0-6.7 atom % Si). A laser repetition frequency of 10 Hz was used at an energy of 250-400 mJ per pulse, for 5000 pulses. Absorption of laser radiation by the target produces, sequentially, melting, vaporization, ejection and plasma formation. The ablated plasma was deposited on borosilicate glass substrates held 73 mm from the target, held at a temperature of 350° C. The deposition chamber was initially evacuated to $5\times10^{-6}$ Torr, and then backfilled with pure oxygen gas to 2-5 mTorr before deposition.

1.2 Sample Preparation

Silicon doped ZnO (SZO) targets were prepared from Zinc oxide (purity, 99.99%) and $SiO_2$ (purity 99.99%) powders. 0-5 wt % $SiO_2$ was used, corresponding to 0-6.655 atom % Si. The powders were mixed in acetone and then fired at 800° C. for 12 hrs in air, ground, and fired again at 800° C. for a further 7 hrs in air. The solubility limit of $SiO_2$ in ZnO and the phase purity of $SiO_2$—ZnO were determined by X-ray powder diffraction (Philips X'Pert diffractometer). Disk-shaped targets, 25 mm in diameter and 2 mm thick were prepared from the sintered powders by standard pellet press (10-14 ton), and then sintered at 800° C. for 7 hrs in air to lend mechanical strength to the target.

The borosilicate glass substrates were cleaned in an ultrasonic cleaner for 15 min with acetone, ethanol and then dried with filtered air before being introduced into the deposition system. Ablation was performed with the laser operating at a repetition frequency of 10 Hz, and energy of 250-400 mJ per pulse for a duration of 5000 pulses.

1.3 Characterisation of Films

The crystalline structure of thin film was studied by X-ray diffractometer (Philips X'Pert diffractometer). The thickness (d) of the films was measured using a surface profilometer (Dektak 3) after etching the film by HBr acid. The film resistivity ρ, conductivity a, carrier concentration 77, and Hall mobility μ were determined from the sheet resistance measurement by a four-point probe Hall measurement system (HMS 3000). The elemental compositions of the films were determined by energy dispersive spectroscopy. Surface morphology of the films was studied using atomic force microscopy (AFM) using a Nanoscope III microscope. The transparencies of the films were also determined. Transparency can be measured using any suitable method. Convenient methods for measuring transparency, including spectroscopic methods, are well known in the art. Transparency can, for instance, be determined by measuring the transmittance of visible light through the sample film and comparing that with the transmittance of visible light through a "standard" or "reference" film (which may, for instance, be a glass film).

2. Results

2.1 Electrical Properties

Figure 2:
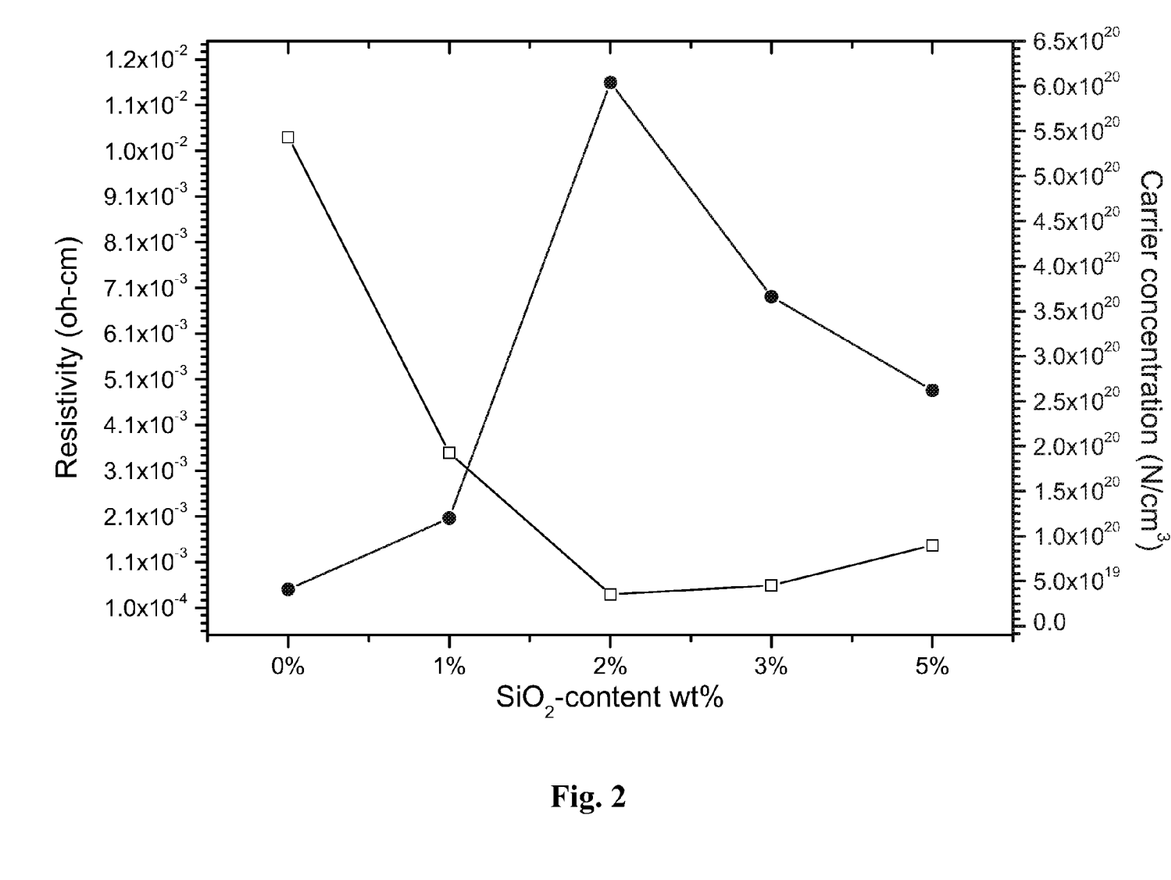
FIG. 2 is a graph of film resistivity, $\rho$ (left hand y axis), in units of $\Omega$cm, versus $SiO_2$ content in the Si—ZnO target (x axis), in units of weight %; data points are shown as hollow squares. The graph also shows carrier concentration, $\eta$, (right hand y axis) in units of $cm^{-3}$ versus the $SiO_2$ content in the Si—ZnO target (x axis) in units of weight %; data points are shown as solid circles.

The electrical properties of Si doped ZnO (SZnO) films depend on both the film composition and the deposition parameters. FIG. 2 shows the typical variation of film resistivity (ρ) and carrier concentration (η) as a function of the $SiO_2$ content in the SZnO targets. The films were deposited at 350° C. and the oxygen was 5 mTorr.

Table 1 shows that the resistivity of the SZnO films was observed to initially decrease with increasing $SiO_2$ content, with maximum conductivity and carrier concentration obtained for 2 wt % $SiO_2$ (which corresponds to about 2.7 atom % silicon in the SZnO film; a molar ratio of Zn to Si of (1−x):x where x is 0.027).

As a small amount of silicon is introduced into the film, it is ionized to $Si^{+4}$, nominally replacing $Zn^{+2}$, with two electrons produced for each zinc atom replacement. The electron density (carrier concentration) of the samples should, therefore, increase linearly with increasing silicon content. Indeed, an initial, linear, increase in carrier concentration is observed and results in a decrease in the resistivity of the film. The resistivity of the films reaches a minimum at 2 wt % of $SiO_2$ (2.7 atom % Si), and thereafter gradually increases with increasing Si content.

It is thought that the decrease in carrier concentration and increase in resistivity beyond 2 wt % of $SiO_2$ content (2.7 atom % Si) is due to increased disorder of the crystal lattice, which causes phonon scattering and ionized impurity scattering and results in a decrease in mobility. It has also been suggested that for films with higher doping levels, the increase in disorder acts to decreases the mobility and free carrier concentration. Alternatively, the increase in resistivity with increasing Si content beyond 2 wt % (2.7 atom %) may be due to the dopant atoms forming neutral defects, which do not contribute free electrons, or to an increase in the concentration of the electron traps as a result of excess Si doping.

TABLE 1

A comparison of resistivity, Hall mobility, carrier concentration, conductivity and transparency for Si doped ZnO films (at different weight percentages of $SiO_2$) with indium tin oxide films (5% Sn), grown on glass substrate at 350° C. and in 5 mTorr of oxygen.

| Sample | Mobility (μ) $cm^2/Vs$ | Carrier Concentration (η) $cm^{-3}$ | Conductivity (σ) $\Omega$ cm | Resistivity (ρ) $\Omega$ cm | Transparency | Thickness nm |
|---|---|---|---|---|---|---|
| ZnO | $1.45 \times 10^{+1}$ | $4.09 \times 10^{+19}$ | $9.54 \times 10^{+1}$ | $1.04 \times 10^{-2}$ | 86.87% | 263 |
| 1% Si—ZnO | $1.47 \times 10^{+1}$ | $1.2 \times 10^{+20}$ | $2.86 \times 10^{+2}$ | $3.49 \times 10^{-3}$ | 80.8% | 277 |
| 2% Si—ZnO | $2.6 \times 10^{+1}$ | $6.04 \times 10^{+20}$ | $2.55 \times 10^{+3}$ | $3.9 \times 10^{-4}$ | 81.5% | 255 |
| 3% Si—ZnO | $1.85 \times 10^{+1}$ | $3.66 \times 10^{+20}$ | $1.67 \times 10^{+3}$ | $5.9 \times 10^{-4}$ | 84.6% | 258 |
| 5% Si—ZnO | $1.6 \times 10^{+1}$ | $2.62 \times 10^{+20}$ | $6.7 \times 10^{+2}$ | $1.47 \times 10^{-3}$ | 83.92% | 270 |
| ITO PLD | $3.2 \times 10^{+1}$ | $6.45 \times 10^{+20}$ | $3.89 \times 10^{+3}$ | $2.57 \times 10^{-4}$ | 83.2% | 260 |
| ITO standard | $3.58 \times 10^{+1}$ | $2.19 \times 10^{+20}$ | $1.26 \times 10^{+3}$ | $7.94 \times 10^{-4}$ | | 150 |

TABLE 1-continued

A comparison of resistivity, Hall mobility, carrier concentration, conductivity and transparency for Si doped ZnO films (at different weight percentages of $SiO_2$) with indium tin oxide films (5% Sn), grown on glass substrate at 350° C. and in 5 mTorr of oxygen.

| Sample | Mobility ($\mu$) cm$^2$/Vs | Carrier Concentration ($\eta$) cm$^{-3}$ | Conductivity ($\sigma$) $\Omega$ cm | Resistivity ($\rho$) $\Omega$ cm | Transparency | Thickness nm |
|---|---|---|---|---|---|---|
| ITO commercial | $3.66 \times 10^{+1}$ | $6.68 \times 10^{+20}$ | $4.03 \times 10^{+3}$ | $2.47 \times 10^{-4}$ | | 175 |

2.2 Structural Properties

Figure 3:
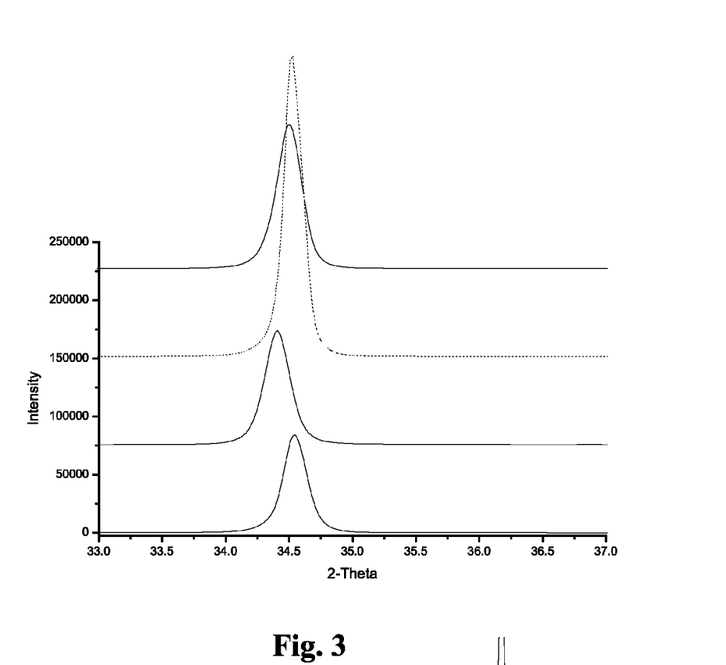
FIG. 3 shows X-ray diffraction spectra (intensity on the y axis versus 2θ, in units of degrees, on the x axis) of an undoped ZnO film (bottom line) and Si-doped ZnO films prepared using 1 weight % (second line from bottom), 2 weight % (second line from top) and 3 weight % (uppermost line) $SiO_2$ content in the Si—ZnO target. Each of the films was deposited at 350° C. on borosilicate glass substrate.
Figure 4:
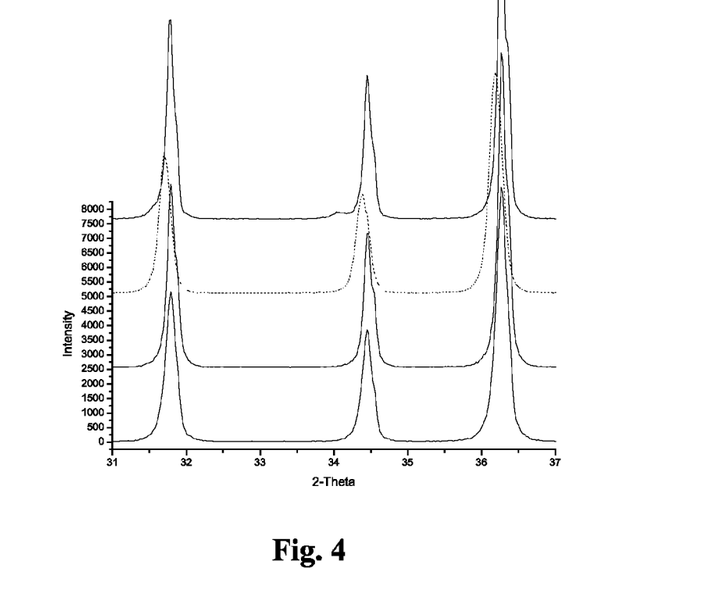
FIG. 4 shows X-ray diffraction spectra (intensity on the y axis versus 2θ, in units of degrees, on the x axis) of bulk undoped ZnO (bottom line) and bulk Si—ZnO prepared using 1 weight % (second line from bottom), 2 weight % (second line from top) and 3 weight % (uppermost line) of $SiO_2$.

The crystalline structure of the films was studied by XRD (Cuk$\alpha$, $\lambda$=1.5406 Å°). FIG. 3 shows the X-ray diffraction patterns for undoped ZnO and Si-doped ZnO films grown at 350° C. in 2-5 mTorr of oxygen. Si-doped ZnO films were always observed to be polycrystalline and showed a similar crystal structure to that of undoped ZnO. Only two diffraction peaks of (002) and (004) orientation can be observed and this result indicates that the Si:ZnO films were strongly oriented with the c axis perpendicular to the quartz substrate plane. The 2 wt % $SiO_2$ (2.7 atom % Si) doped ZnO thin film had the highest (002) diffraction peak intensity. Moreover, the peak intensities of those films decreased with increased doping concentration more than 2 wt %. The (002) diffraction peak intensity had a tendency to decrease with an increase in doping concentration in films. This indicates that an increase in doping concentration deteriorates the crystallinity of films, which may be due to the formation of stresses by the difference in ion size between zinc and the dopant and the segregation of dopants in grain boundaries for high doping concentration. The XRD spectra peak locations are slightly shifted with respect to those of pure ZnO as can be seen in FIGS. 3 and 4. The XRD spectrum shows no similarities to the expected powder pattern peak intensities, which would suggest that the films are textured.

2.3 Surface Morphology

Figure 5:
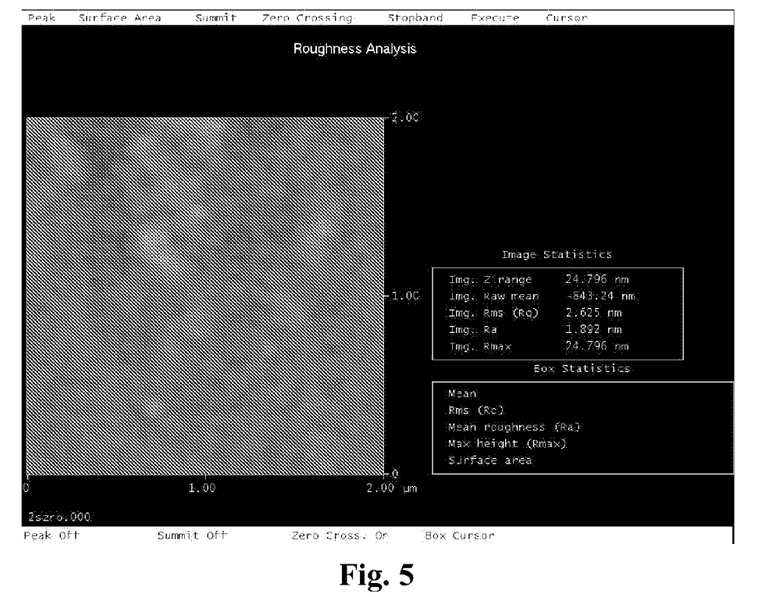
FIG. 5 shows an atomic force microscopy (AFM) image (2 μm×2 μm) of a Si-doped ZnO film prepared by pulsed laser deposition on borosilicate glass substrate. Grain growth is shown to occur in a direction perpendicular to the substrate surface. The root mean square (RMS) surface roughness is 3.2 nm.
Figure 6:
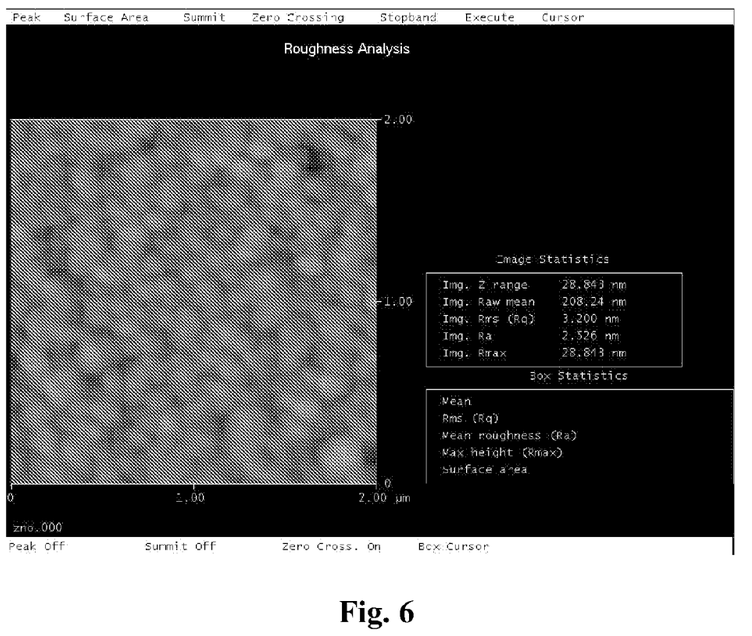
FIG. 6 shows an atomic force microscopy (AFM) image (2 μm×2 μm) of an undoped ZnO film prepared by pulsed laser deposition on borosilicate glass substrate. Grain growth is shown to occur in a direction perpendicular to the substrate surface. The RMS surface roughness is 2.62 nm.

FIGS. 5 and 6 show 2-D atomic force microscopy (AFM) images (2 $\mu$m×2 $\mu$m) of the undoped (FIG. 6) and Si-doped (FIG. 5) films deposited by PLD technique on borosilicate substrate. As in these images the grain growth in the direction perpendicular to the substrate surface. The root-mean-square (RMS) surface roughness value of the Si-doped film was 2.62 nm, compared to a value of 3.2 nm for the undoped ZnO.

Example 2

Figure 7:
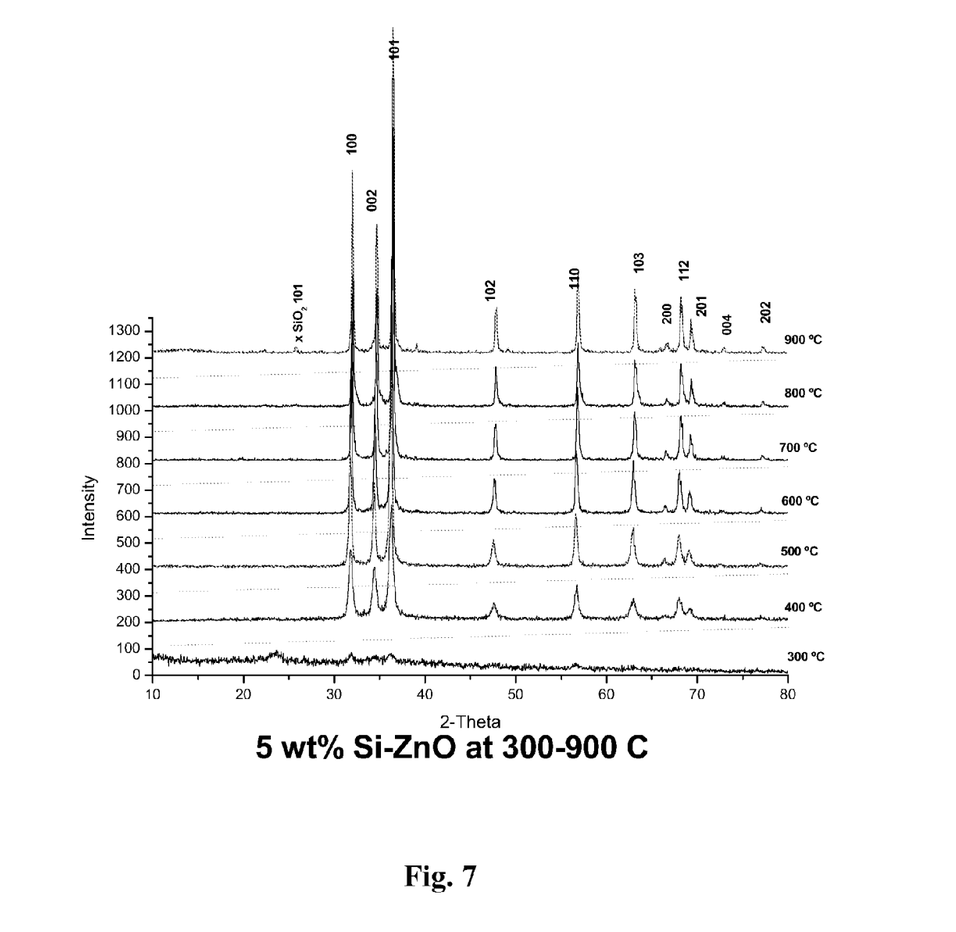
FIG. 7 shows X-ray diffraction spectra (intensity on the y axis, versus 2θ, in units of degrees, on the x axis) of Si-doped ZnO ("$SiO_2$—ZnO") containing 5 weight % $SiO_2$, prepared using the solution phase synthesis method of Example 2. The spectra were recorded, respectively, at sample temperatures of 300° C. (bottom spectrum), 400° C., 500° C., 600° C., 700° C., 800° C. and 900° C. (top spectrum).
Figure 8:
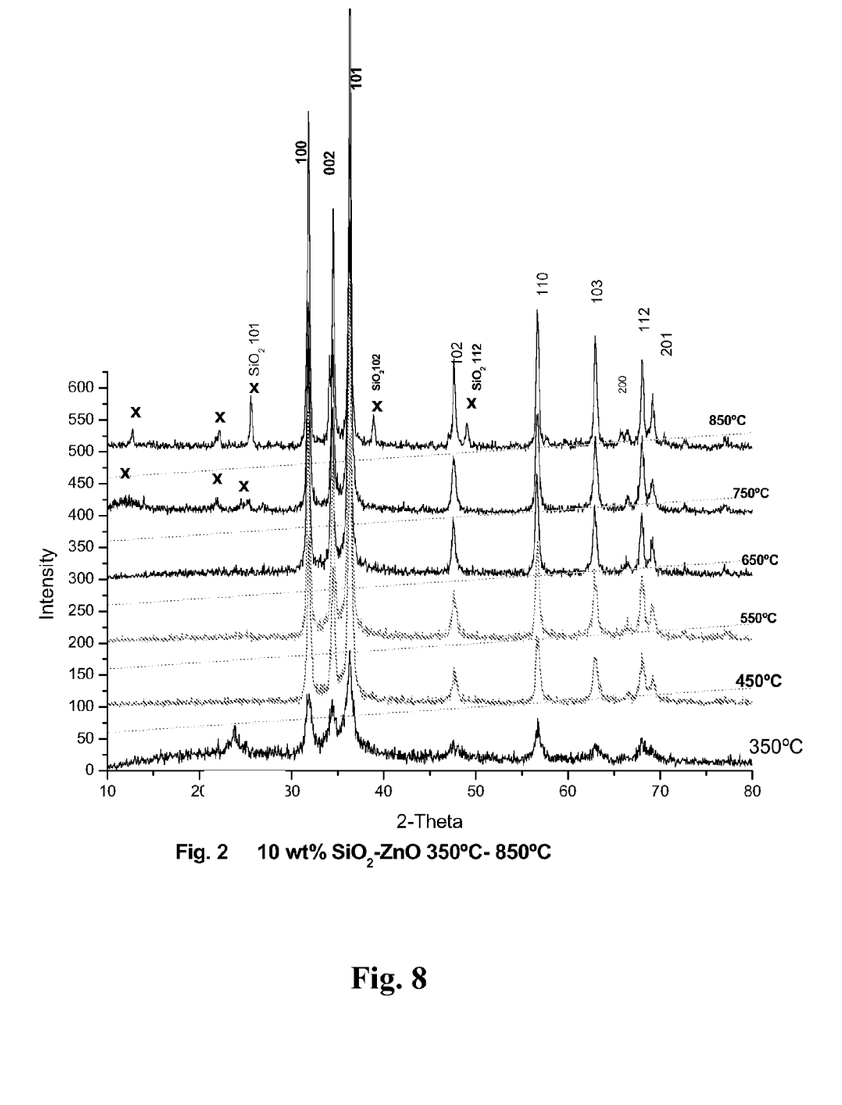
FIG. 8 shows X-ray diffraction spectra (intensity on the y axis, versus 2θ, in units of degrees, on the x axis) of Si-doped ZnO ("$SiO_2$—ZnO") containing 10 weight % $SiO_2$, prepared using the solution phase synthesis method of Example 2. The spectra were recorded, respectively, at sample temperatures of 350° C. (bottom spectrum), 450° C., 550° C., 650° C., 750° C. and 850° C. (top spectrum).

Low-Temperature Preparation of a Single Phase of Nanopowder of 5 wt % and 10 wt % of $SiO_2$—ZnO Zinc citrate solution was prepared by adding zinc oxide into a citric acid solution with a 1:2 molar ratio of metal ions to citric acid. The solution was heated up to 70° C., and 5 ml of 65% $HNO_3$ added with stirring. Stirring was continued for 2 hrs. The appropriate ratio of silicon tetra-acetate was dissolved in hot ethylene glycol and the solution was then heated up to 110° C. The temperature of zinc citrate solution was increased to 90° C. with stirring and the silicon acetate solution in ethylene glycol added, with the temperature maintained for 2 hrs. The temperature of the mixture was then increased to 130° C. and a pale yellow clear solution obtained. The temperature for was maintained for 14 hrs, and then increased to 170-180° C., at which point the solution converts to a dark brown thick solution. The solution was heated to dryness at 250° C. for 7 hrs, and the resultant powder was ground and then heated again at 350° C. for 7 hrs and then finally at 400° C. XRD shows single phase with good crystallinity (FIGS. 7 and 8).

The invention claimed is:

1. A transparent conducting film which comprises a compound of formula (I):

$$Zn_{1-x}[M]_xO_{1-y}[X]_y \qquad (I)$$

wherein:
  x is greater than 0 and less than or equal to 0.25;
  y is from 0 to 0.1;
  [X] is at least one dopant element which is a halogen; and
  [M] is a combination of two or more different dopant elements, one of which is Si and another of which is In.

2. A transparent conducting film according to claim 1 wherein x is from 0.01 to 0.05.

3. A transparent conducting film according to claim 1 wherein [X] is F and y is greater than 0 and less than or equal to 0.1.

4. A transparent conducting film according to claim 1 wherein y is 0.

5. A transparent conducting film according to claim 1, which film has a resistivity, $\rho$, of less than or equal to about $4.0 \times 10^{-3}$ $\Omega$cm.

6. A transparent conducting film according to claim 1, which film has a resistivity, $\rho$, of less than or equal to about $8.0 \times 10^{-4}$ $\Omega$cm.

7. A transparent conducting film according to claim 1 which has a mean optical transparency in the visible range of the spectrum of greater than or equal to about 75%.

8. A transparent conducting film according to claim 1 which has a patterned structure.

9. A transparent conducting film according to claim 1 which comprises two or more different layers.

10. A transparent conducting coating which comprises a transparent conducting film as defined in claim 1.

11. A transparent conducting coating according to claim 10 which is an antistatic coating, an optical coating, a heat-reflecting coating, an antireflection coating, an electromagnetic interference shield, a radio-frequency interference shield, an electrowetting coating, or a coating for a display, for a touch panel or for a sensor.

12. An organic light-emitting device, an electroluminescent device, a solid-state light, a photovoltaic device, a solar cell, a photodiode, a transparent electronic device, an electrode, a display, a touch panel, a sensor, a window, flooring material, a mirror, a lens, a Bragg reflector, a strain gauge or a radio-frequency identification (RFID) tag which comprises a transparent conducting coating as defined in claim 10 or a transparent conducting film as defined in claim 1.

13. A display as defined in claim 12 which is a liquid crystal display, an electroluminescent display, an electrochrome display, a flat panel display, a plasma display, electronic paper or a field emission display.

14. A polymer or glass which is coated with a transparent conducting coating as defined in claim 10.

15. A process for producing a transparent conducting film, which film comprises a compound of formula (I):

$$Zn_{1-x}[M]_xO_{1-y}[X]_y \qquad (I)$$

wherein:
  x is greater than 0 and less than or equal to 0.25;
  y is from 0 to 0.1;
  [X] is at least one dopant element which is a halogen; and
  [M] is a combination of two or more different dopant elements, one of which is Si and another of which is In;
which process comprises producing said film by pulsed laser deposition.

16. A process according to claim 15 which comprises:
  (a) providing a target material in a chamber, which target material comprises the elements Zn, O, [M] and optionally [X] wherein [M] and [X] are as defined in claim 13;
  (b) providing a substrate in the chamber;
  (c) focusing a pulsed laser beam on the target material to generate a plasma; and
  (d) depositing the plasma on the substrate to form the film.

17. A process according to claim 16 wherein the target material is produced by heating a mixture of zinc oxide and an oxide of [M].

18. A process according to claim 17 wherein the mixture of zinc oxide and an oxide of [M] is heated at a temperature of from about 600° C. to about 1000° C.

19. A process according to claim 16 wherein the target material is produced by:
  (a1) heating a solution comprising a zinc compound and a compound comprising [M];
  (a2) performing a solvent removal step; and
  (a3) heating the resulting solid to produce said target material.

20. A process according to claim 19 wherein the temperature of said heating in step (a1) does not exceed 200° C. and wherein the temperature of said heating in step (a3) does not exceed 500° C.

21. A process according to claim 16 wherein the process further comprises (i) providing one or more further target materials in the chamber, which one or more further target materials are different from said target material which comprises Zn, O, [M] and optionally [X], and (ii) growing a multilayer film on said substrate by alternatively using the different target materials.

22. A process according to claim 16 wherein step (d) of the process further comprises forming a patterned structure on the substrate.

23. A process according to claim 16 wherein the plasma is deposited on only a portion of the surface of the substrate, in order to form a patterned film.

24. A process according to claim 15 wherein the process further comprises subjecting the film to etching, thereby producing a patterned film.

25. A transparent conducting film obtained by a process for producing a transparent conducting film, which film comprises a compound of formula (I):

$$Zn_{1-x}[M]_xO_{1-y}[X]_y \qquad (I)$$

wherein:
  x is greater than 0 and less than or equal to 0.25;
  y is from 0 to 0.1;
  [X] is at least one dopant element which is a halogen; and
  [M] is a combination of two or more different dopant elements, one of which is Si and another of which is In;
which process comprises producing said film by pulsed laser deposition.

* * * * *